(12) United States Patent
Hong et al.

(10) Patent No.: US 7,710,023 B2
(45) Date of Patent: May 4, 2010

(54) ORGANIC ELECTROLUMINESCENT DEVICE AND FABRICATION METHOD THEREOF

(75) Inventors: Soon Kwang Hong, Daegu-Si (KR); Jae Won Chang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 840 days.

(21) Appl. No.: 11/442,398

(22) Filed: May 30, 2006

(65) Prior Publication Data

US 2006/0267490 A1    Nov. 30, 2006

(30) Foreign Application Priority Data

May 31, 2005    (KR)    ...... 10-2005-0045920

(51) Int. Cl.
*H01J 1/62*    (2006.01)
(52) U.S. Cl. .................. 313/506; 313/504; 445/24
(58) Field of Classification Search ......... 313/498–512; 445/24
See application file for complete search history.

(56) References Cited

U.S. PATENT DOCUMENTS

| | | | |
|---|---|---|---|
| 2002/0190924 A1 | 12/2002 | Asano et al. | |
| 2005/0014379 A1* | 1/2005 | Choi et al. | 438/700 |
| 2005/0162079 A1* | 7/2005 | Sakamoto | 313/504 |

FOREIGN PATENT DOCUMENTS

| | | |
|---|---|---|
| CN | 1338719 A | 3/2002 |
| EP | 1 594 347 A1 | 11/2005 |
| KR | 10 2003-0015409 A | 2/2003 |
| WO | WO 2004/073356 A1 | 8/2004 |
| WO | WO-2004-073356 A1 | 8/2004 |

* cited by examiner

*Primary Examiner*—Bumsuk Won
(74) *Attorney, Agent, or Firm*—Birch, Stewart, Kolasch & Birch LLP

(57) ABSTRACT

An organic electroluminescent device and a fabricating method thereof are provided. The organic electroluminescent device includes a plurality gate lines and data lines crossly arranged on a substrate for defining red, green and blue sub pixels of a pixel; a non-emitting region formed in each of the sub pixels and including a switching element and a driving element; and an emitting region formed in each of the sub pixels and including a pixel electrode connected to the corresponding driving element, wherein locations of at least two of the non-emitting regions are different from each other with respect to the corresponding sub pixels.

16 Claims, 7 Drawing Sheets

ORGANIC ELECTROLUMINESCENT DEVICE AND FABRICATION METHOD THEREOF

The present application claims, under 35 U.S.C. §119, the priority benefits of Korean Patent Application No. 10-2005-0045920 filed on May 31, 2005 in the Republic of Korea, the entire contents of which are herein fully incorporated by reference.

BACKGROUND OF THE INVENTION

1. Field of the Invention

The present invention relates to an organic electroluminescent device that can provide an improved image quality and have price competitiveness, and a fabrication method thereof.

2. Description of the Related Art

Generally, organic electroluminescent devices (OELD) emit light using energy released from exited electrons when the excitons transit from an excited state to a ground state after generating the excitons by injecting electros and holes from a cathode and an anode.

Since the organic electroluminescent device (OELD) emits light by itself, a separate light source is not required in the OELD, while a liquid crystal display device (LCD) requires a separate light source such as a backlight unit. Therefore a volume and a weight of a display device can be reduced using the organic electroluminescent device.

The organic electroluminescent device (OELD), furthermore, has high-quality panel characteristics such as low-power consumption, high-luminance, rapid response time, and being light-weight. Due to such high-quality panel characteristics, the OELD has been spotlighted as a next generation of a display device, which may be applied into consumer electronic devices such as a mobile communication terminal, a CHS, a PDA, a camcorder and a Palm PC.

Such an OELD may be manufactured through a simple fabricating method compared to other flat display devices. Accordingly, the manufacturing cost of the OELD may be significantly low compared to a conventional LCD device.

A driving mode of the OELD is classified into a passive matrix type and an active matrix type.

The passive matrix type OELD has a simple structure, and a fabrication method thereof is also simple. However, the passive matrix type OELD has disadvantages such as high power consumption, difficulty in embodying a large-screen OELD and a dropping of an opening-ratio in proportional to the number of lines.

The active matrix type OELD provides a high emitting ratio and a high-image quality.

FIG. 1 shows an organic electroluminescent device (OELD) according to a related art.

Referring to FIG. 1, the organic electroluminescent device (OELD) 10 includes a thin film transistor (TFT) array 14 formed on a first transparent substrate 12, a first electrode 16 formed on the TFT array 14, an organic light emitting layer 18 and a second electrode 20.

The light emitting layer 18 expresses red, green and blue colors. Such a light emitting layer 18 is generally formed by depositing organic materials emitting the red, green and blue colors at each of pixels P and patterning the organic materials.

The organic electroluminescent device 10 is fabricated in a capsulated shape by adhering the first substrate 12 to a second substrate 28 having a moisture absorption 22 through a sealant 26.

The moisture absorption 22 is for removing moisture and oxygen which may penetrate into the capsulated electroluminescent device 10. In order to form the moisture absorption 22 on the second substrate 28, a predetermined region of the substrate 28 is etched, the etched region is filled with the moisture absorption 22 and the moisture absorption 22 is fixed using a tape 25.

Hereinafter, a TFT array that is a pixel in an OELD according to a related art will be described with reference to FIG. 2.

FIG. 2 is a plan view showing a thin film transistor (TFT) array in an organic electroluminescent device (OELD) according to a related art.

An active matrix type TFT array includes a plurality of pixels defined on a substrate 12. Each of the pixels includes a switching thin film transistor (TFT) $T_S$, a driving thin film transistor (TFT) $T_D$ and a storage capacitor $C_{ST}$. Each of the switching TFT $T_S$ and the driving TFT $T_D$ may be configured of one or more thin film transistors according to the driving characteristics.

The substrate 12 may be a transparent insulating substrate made of glass or plastic.

As shown in FIG. 2, a gate line 32 is arranged on the substrate 12 in one direction and a data line 34 is arranged to cross the gate line 32 with an insulating layer interposed.

At the same time, a power line 35 is formed to be separated from the data line 34 at a predetermine distance in parallel.

Thin film transistors configured of gate electrodes 36 and 38, active layers 40 and 42, source electrodes 46 and 48 and drain electrodes 50 and 52 are used as the switching TFT $T_S$ and the driving TFT $T_D$.

As described above, the gate electrode 36 of the switching TFT $T_S$ is connected to the gate line 32, and the source electrode 46 is connected to the data line 34.

The drain electrode 50 of the switching TFT $T_S$ is connected to the gate electrode 38 of the driving TFT $T_D$ through a contact hole 54.

The source electrode 48 of the driving TFT $T_D$ is connected to the power line 36 through a contact hole 56.

The drain electrode 52 of the driving TFT $T_D$ is formed to contact the first electrode 16 formed at the pixel region P.

The power line 35 and the first electrode 16 which is a poly-crystal silicon layer formed under the power line 35 form the storage capacitor $C_{ST}$ by being overlapped with one another with the insulating layer interposed therebetween.

Hereinafter, a pixel arrangement of the related art organic electroluminescent device (OELD) will be described with reference to FIGS. 3A to 3C.

FIGS. 3A to 3C show arrangements of sub pixels in an organic electroluminescent device according to a related art.

Referring to FIGS. 3A to 3C, red, green and blue sub pixels are arranged based on a RGB stripe mode, a RGB mosaic mode and a RGB delta mode, respectively.

In the RGB strip mode as shown in FIG. 3A, the red, green and blue sub pixels of a pixel P are arranged in sequence at each of lines. In the RGB mosaic mode as shown in FIG. 3B, the red, green and blue sub pixels of a pixel P are arranged in sequence at a first line, and the green, the blue and red sub pixels of another pixel are arranged in sequence at a second line. At the third line, the blue, the red and green sub pixels of another pixel are arranged in sequence. In the R G B delta mode as shown in FIG. 3C, the red, green and blue sub pixels of a pixel P are arranged in sequence at each of the lines with the sub pixels of a pixel P arranged at even lines deviated from those of another pixel arranged at odd lines at a predetermined distance.

Each of the red, green and blue sub pixels in each pixel in the related art OELD is formed to have a vertical side longer than a horizontal side. Also each pixel in the related art OELD is formed by arranging the red, green and blue sub pixels in the horizontal direction, and the related OELD is formed by repeatedly arranging such pixels.

However, general visual information includes lots of horizontal information compared to vertical movement. Therefore, the conventional arrangement of sub pixels cannot display images naturally.

In order to naturally display visual information having lots of horizontal movement through the conventional OELD, a resolution thereof must be increased.

SUMMARY OF THE INVENTION

Accordingly, the present invention is directed to an organic electroluminescent device and a fabrication method thereof that substantially obviates one or more problems due to limitations and disadvantages of the related art.

An object of the present invention is to provide an organic electroluminescent device for providing a nature image.

Another object of the present invention is to provide an organic electroluminescent device requiring a less manufacturing cost through reducing the number of D-ICs and the number of pins.

Still another object of the present invention is to provide an organic electroluminescent device for improving an image quality by asymmetrically forming non-emitting regions in red, green and blue sub pixels which are vertically arranged in a pixel in the organic electroluminescent device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided according to an embodiment an organic electroluminescent device including: a gate line and a data line crossly arranged on a substrate for defining red, green and blue sub pixels; an non-emitting region formed in each of the sub pixels and including a switching element and a driving element which are configured of a thin film transistor having a gate electrode, an active layer, a source electrode and a drain electrode; and an emitting region formed in each of the sub pixels and including a pixel electrode connected to the drain electrode of the driving element, wherein at least one of non-emitting regions in the red, green and blue sub pixels is formed at a different location.

The organic electroluminescent device may further include a power line formed to contact the source electrode of the driving element. The non-emitting regions in the adjacent sub pixels may be formed at different locations. At least two of the red, green and blue sub pixels may include non-emitting regions formed at different locations. The sub pixels may be arranged in a vertical direction. Each of the sub pixels may be formed to have a horizontal side longer than a vertical side. The emitting regions may be formed by patterning red, green and blue organic material.

In another aspect of the present invention, there is provided a method of fabricating an organic electroluminescent device including: defining red, green and blue sub pixels which are arranged on a substrate in a vertical direction; forming a switching element and a driving element connected to the switching element in different non-emitting regions in at least two of the red, green and blue sub pixels; forming a pixel electrode to contact the drain electrode of the driving element in each of the red, green and blue sub pixels; and forming an organic light emitting layer at an emitting region of the sub pixels.

The non-emitting regions of the adjacent sub pixels may be formed at different locations. Each of the sub pixels may be formed to have a horizontal side longer than a vertical side. At least one of the red, green and blue sub pixels may include a non-emitting region formed at a different location compared to those formed in the other sub pixels. The non-emitting regions formed in the sub pixels may be vertically formed in a form of a zigzag pattern.

According to another aspect, the present invention provides an organic electroluminescent device comprising: a plurality gate lines and data lines crossly arranged on a substrate for defining red, green and blue sub pixels of a pixel; a non-emitting region formed in each of the sub pixels and including a switching element and a driving element; and an emitting region formed in each of the sub pixels and including a pixel electrode connected to the corresponding driving element, wherein locations of at least two of the non-emitting regions are different from each other with respect to the corresponding sub pixels.

According to another aspect, the present invention provides a method of fabricating an organic electroluminescent device, the method comprising: forming a plurality gate lines and data lines crossly arranged on a substrate to define red, green and blue sub pixels of a pixel; forming a non-emitting region in each of the sub pixels, each non-emitting region including a switching element and a driving element; and forming an emitting region in each of the sub pixels, each emitting region a pixel electrode connected to the corresponding driving element, wherein locations of at least two of the non-emitting regions are different from each other with respect to the corresponding sub pixels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
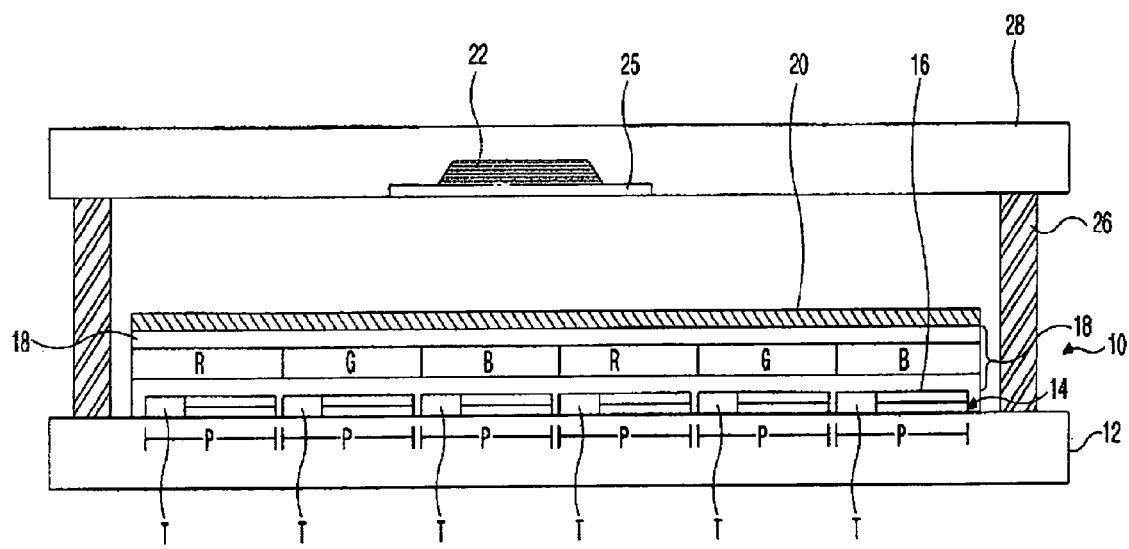
FIG. 1 shows an organic electroluminescent device (OELD) according to a related art.
Figure 2:
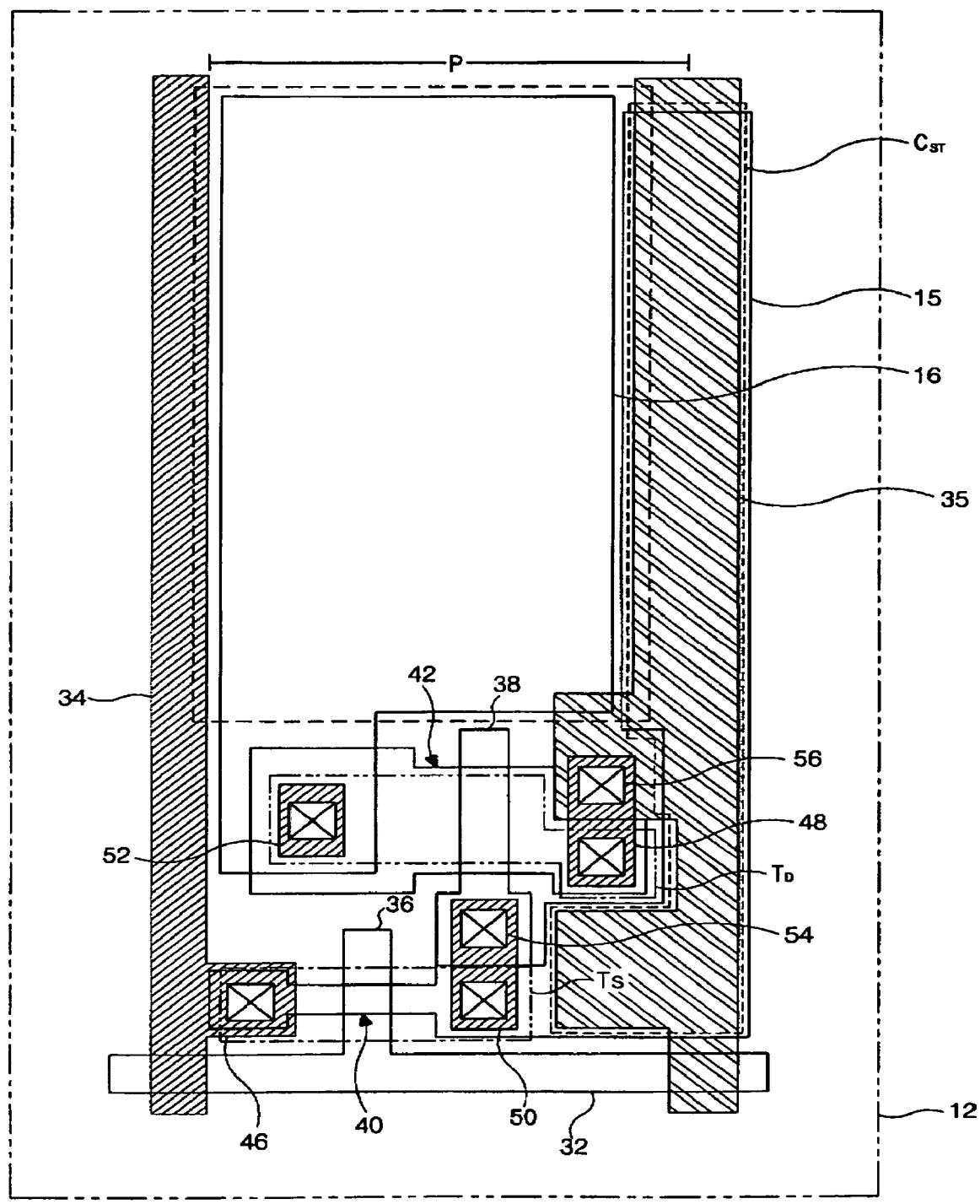
FIG. 2 is a plan view showing a thin film transistor (TFT) array in an organic electroluminescent device (OELD) according to a related art.
Figure 3A:
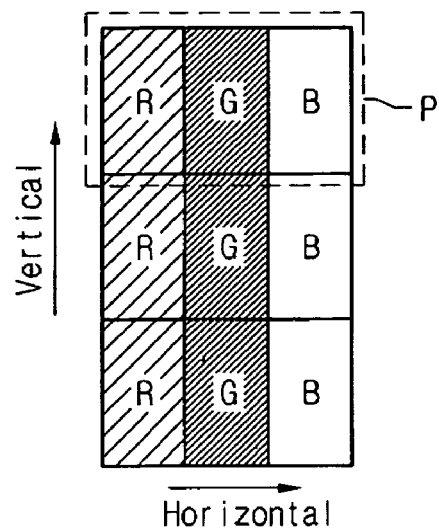
FIGS. 3A to 3C show arrangements of sub pixels in an organic electroluminescent device according to a related art.
Figure 3B:
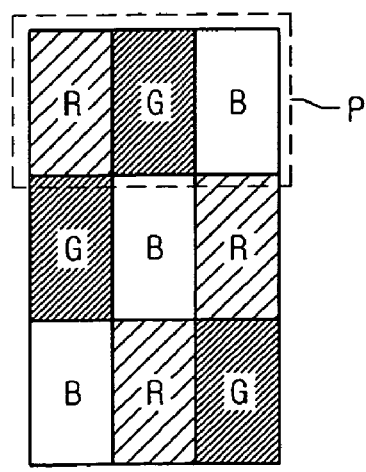
Figure 3C:
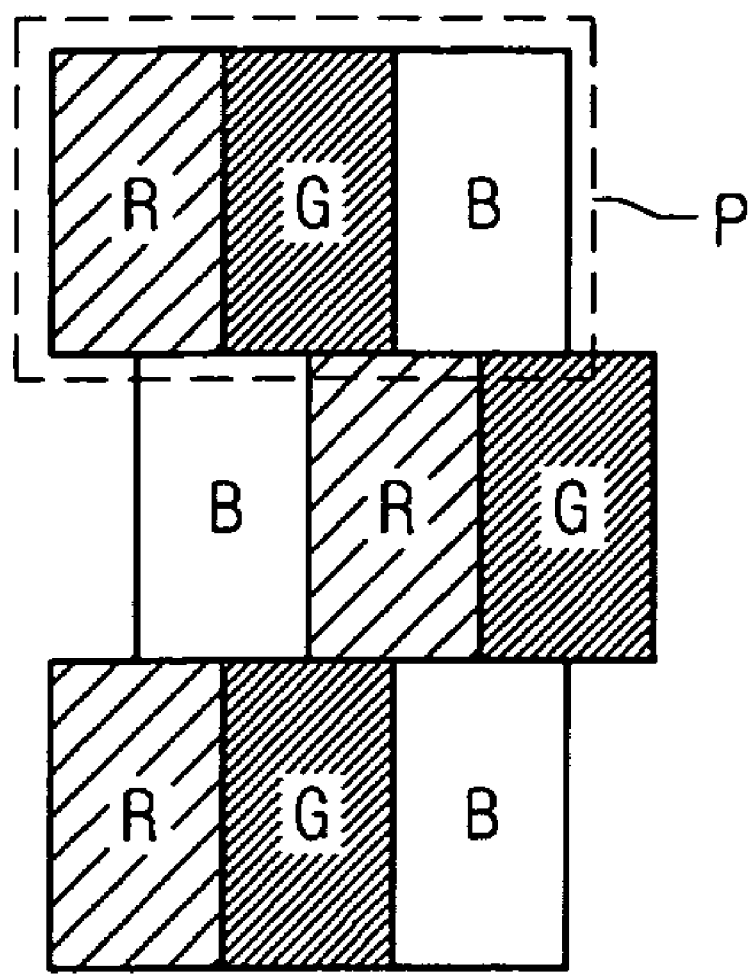
Figure 4:
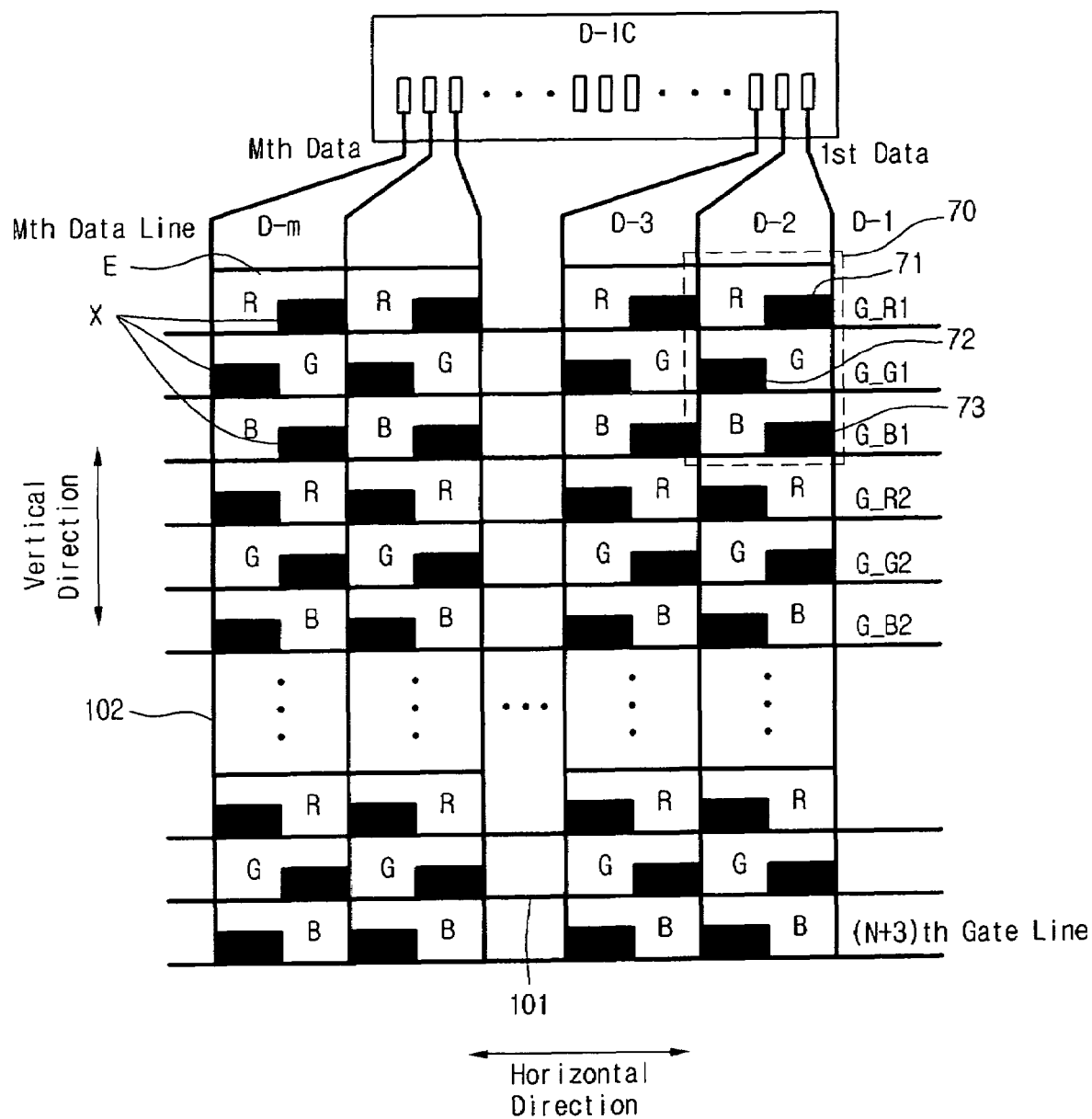
FIG. 4 is a plan view illustrating a pixel structure in a vertically-arranged RGB driving mode of an organic electroluminescent device according to an embodiment of the present invention.

FIG. 4 is a plan view illustrating a pixel structure in a vertically-arranged RGB driving mode of an organic electroluminescent device (OELD) according to an embodiment of the present invention. All the components of the OELD are operatively coupled and configured. For instance, the OELD of the present invention as shown in FIG. 4 includes known components and their configurations, e.g., as shown in FIGS. 1 and 2, as long as they are adapted in view of and compatible with the inventive features of the present invention.

As shown in FIG. 4, a pixel in the vertically-arranged RGB driving mode of the OELD according to the present embodiment includes a plurality of red R, green G and blue B sub pixels SP, which are vertically arranged (70) in a stripe mode. Each of the R, the G and the B sub pixels is formed to have a horizontal side longer than a vertical side.

Each sub pixel SP is configured of an emitting region E and a non-emitting region X. The emitting region E displays red, green and blue colors. The emitting region E is formed by patterning a related organic material. A switching thin film transistor (TFT) 104 and a driving thin film transistor (TFT) 105 (FIG. 5) are formed at each non-emitting region X.

In FIG. 4, D_1, D_2, D_3, D_4, . . . , D_M denote data signal lines (data lines 102), whereas G_R1, G_R2, G_R3, . . . , G_Rn; G_G1, G_G2, G_G3, . . . and G_Gn; and G_B1, G_B2, G_B3, . . . , G_Bn denote scan lines for supplying a scan signal to each of red, green and blue sub pixels, which are gate lines 101.

The data lines 102 (D_1, D_2, D_3, D_4, . . . , D_m) are arranged along one side of the pixel. The switching thin film transistor 104 and the driving thin film transistor 105 are formed at the one side of the data line 102.

In the vertically-arranged RGB driving mode of the organic electroluminescent device according to the present embodiment, the sub pixels of each pixel (70 in FIG. 4) are arranged in a vertical direction, and each of the sub pixels has a horizontal side longer than a vertical side. The pixel receives a signal through the data line 102, and such a signal is supplied to the red, green and blue sub pixels at the same time. Such a structure of the pixel according to the present embodiment requires a less number of D-ICs (driving ICs) and pins to supply the signal to the sub pixels. Therefore, the manufacturing cost thereof may be reduced according to the present embodiment.

In each non-emitting region X, the switching TFT 104 and the driving TFT 105 are formed. Since the non-emitting region X includes a plurality of thin film transistors in a pixel region and a power line 103 is extended through the pixel region (FIG. 5), the non-emitting region X occupies a large portion of the pixel region.

If the non-emitting regions X are symmetrically and regularly arranged in the sub pixels, an image quality may be degraded. In order to prevent the image quality from being degraded, the non-emitting regions are asymmetrically and/or irregularly arranged in the sub pixels according to the present embodiment.

For example, if the non-emitting region X (71 in FIG. 4) is formed at the bottom right side of the red sub pixel, a non-emitting region X (72) is formed at the bottom left side of the green sub pixel which is vertically adjacent to the red sub pixel. Also, a non-emitting region X (73) is formed at the bottom right side of the blue sub pixel which vertically is adjacent to the green sub pixel.

As described above, the non-emitting regions X are asymmetrically formed (or in a zig-zag pattern) in the red, the green and the blue sub pixels in the vertically-arranged RGB mode of the OELD according to the present embodiment.

Figure 5:
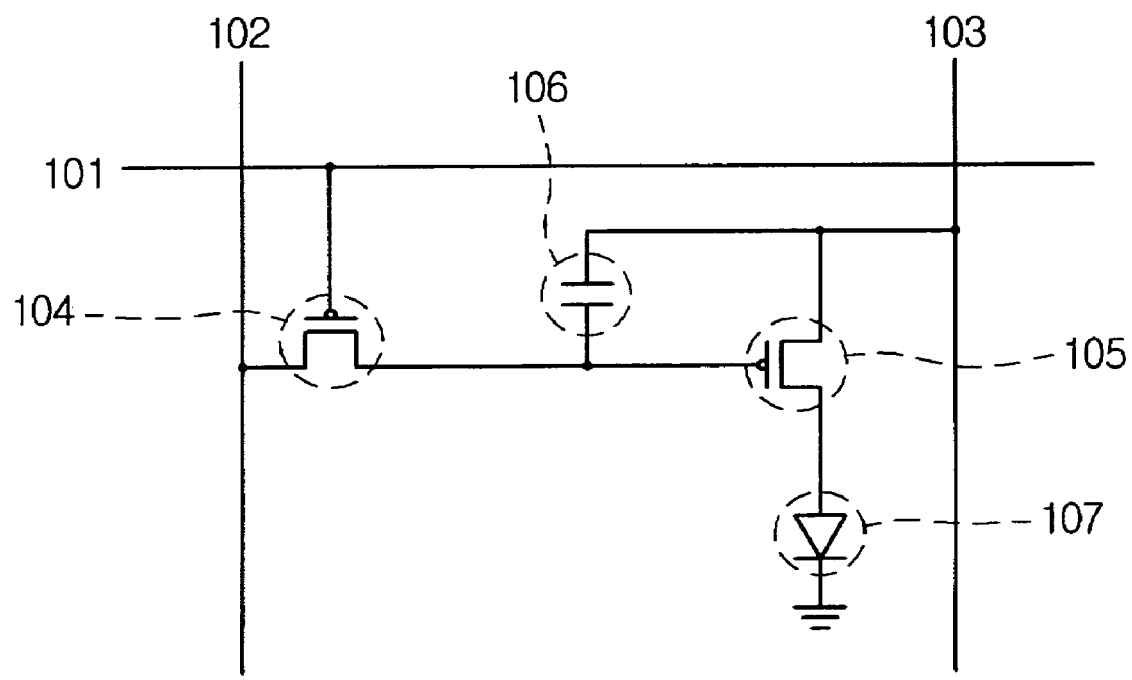
FIG. 5 is a circuit diagram showing a driving element formed at an non-emitting region in a pixel of the organic electroluminescent device of FIG. 4.

FIG. 5 is a circuit diagram showing a driving element formed at a non-emitting region in a pixel of the organic electroluminescent device of FIG. 4.

As shown FIG. 5, the pixel of the organic electroluminescent device according to the present embodiment includes the switching TFT 104, the driving TFT 105, a storage capacitor 106 and an emitting diode 107.

The gate electrode of the switching TFT 104 is connected to a gate line 101, and the source electrode of the switching TFT 104 is connected to a data line 102.

The drain electrode of the switching TFT 104 is connected to the gate electrode of the driving TFT 105, and the drain electrode of the driving TFT 105 is connected to the anode electrode of the emitting diode 107.

The source electrode of the driving TFT 105 is connected to a power line 103, and the cathode electrode of the emitting diode 107 is grounded.

The storage capacitor 106 is connected to the gate electrode and the source electrode of the driving TFT 105.

Therefore, the switching TFT 104 is turned on when a signal is supplied through the gate line 101, and an image signal from the data line 102 is stored at the storage capacitor 106 through the switching TFT 104. The image signal drives the driving TFT 105 by being transferred to the gate electrode of the driving TFT 105. As a result, the emitting diode 107 emits light. Herein, the luminance thereof is controlled by controlling the current that flows to the emitting diode 107.

Even after the switching TFT 104 is turned off, the voltage stored in the storage capacitor 106 drives the driving TFT 105. Therefore, the emitting diode 107 continuously emits light by receiving the current stored at the storage capacitor 106 until a next image signal of a next scene is inputted.

The described non-emitting region may be formed at various locations in the sub pixels.

Figure 6A:
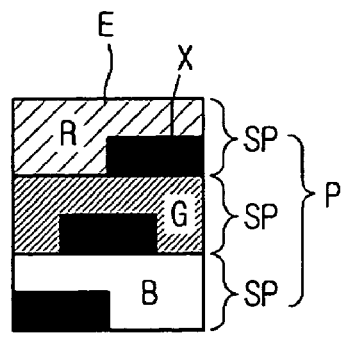
FIGS. 6A to 6C show arrangements of sub pixels in a pixel of an organic electroluminescent device according to the present invention.
Figure 6B:
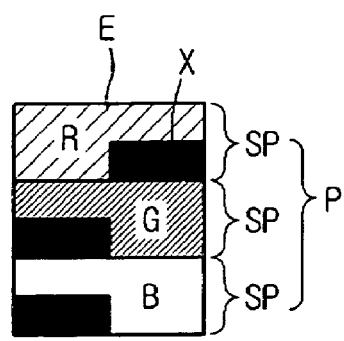
Figure 6C:
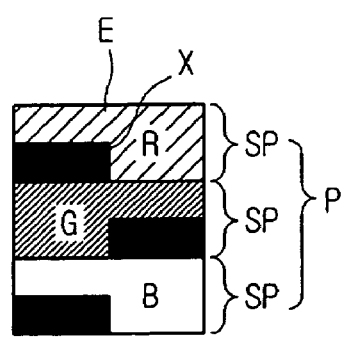

FIGS. 6A to 6C show different examples of arrangements of sub pixels in a pixel of an organic electroluminescent device according to the present invention. For instance, each of these arrangements can be applied to replace the non-emitting region arrangement of the pixel 70 and other pixels in the OELD of FIG. 4.

Referring to FIGS. 6A to 6C, a pixel in the vertically-arranged RGB driving mode of the OELD according to these examples includes a plurality of red R, green G and blue B sub pixels SP, which are vertically arranged in a stripe mode. Each of the R, the G and the B sub pixels is formed to have a horizontal side longer than a vertical side.

Each of the sub pixels includes the emitting region and the non-emitting region. The emitting region displays the red, green and blue colors. The emitting region is formed by patterning a corresponding organic material. The non-emitting region includes a switching thin film transistor (TFT) and a driving TFT, e.g., as shown and described in connection with FIG. 5.

As shown in FIG. 6A, in each pixel, the non-emitting regions X are formed at a right side of a red sub pixel, at a center of a green sub pixel and at a left side of a blue sub pixel, respectively.

In other examples, as shown in FIGS. 6B and 6C, for each pixel at least one of the non-emitting regions X is formed at a different side of sub pixels of the pixel.

That is, the non-emitting regions X are irregularly formed at the sub pixels in order to minimize optical interference. Such a structure of the non-emitting regions may prevent the image quality from being degraded. For example, it prevents block dim that regularly appears on the display.

In the vertically-arranged RGB driving mode of the organic electroluminescent device according to the present invention, a plurality of sub pixels of one or more pixels are vertically arranged where each of the sup pixels has its horizontal side longer than its vertical side, and the signal supplied to the corresponding pixel through the data line is supplied to the red, green and blue sub pixels at the same time. Such a pixel structure according to the present invention requires a less number of D-ICs and pins. Therefore, the manufacture cost thereof may be reduced.

In the vertically-arranged RGB driving mode of the organic electroluminescent device according to the present invention, the non-emitting regions X are irregularly formed at the sub pixels for one or more pixels in order to minimize optical interference. Such a structure of the non-emitting regions may improve the image quality by preventing block dim that regularly appears on the display.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescent device comprising:
   a plurality gate lines and data lines crossly arranged on a substrate for defining red, green and blue sub pixels of a pixel;
   a non-emitting region formed in each of the sub pixels and including a switching element and a driving element; and
   an emitting region formed in each of the sub pixels and including a pixel electrode connected to the corresponding driving element,
   wherein locations of at least two of the non-emitting regions are different from each other with respect to the corresponding sub pixels,
   wherein each of the switching element and the driving element is configured with a thin film transistor having a gate electrode, an active layer, a source electrode and a drain electrode,
   wherein the drain electrode of the driving element is connected to an anode electrode of an emitting diode,
   wherein each of the red, green and blue sub pixels is formed to have a horizontal side longer than a vertical side, and
   wherein the horizontal side is parallel to the gate line and the vertical side is parallel to the data line.

2. The organic electroluminescent device according to claim 1, further comprising:
   a power line formed to contact the source electrode of the driving element.

3. The organic electroluminescent device according to claim 1, wherein the non-emitting regions in the immediately adjacent sub pixels are formed at different locations.

4. The organic electroluminescent device according to claim 1, wherein the red, green and blue sub pixels of the pixel are arranged in a vertical direction.

5. The organic electroluminescent device according to claim 1, wherein the emitting regions are made of red, green and blue organic materials.

6. The organic electroluminescent device according to claim 1, wherein the non-emitting regions of the red, green and blue sub pixels of the pixel are in a staggered pattern.

7. The organic electroluminescent device according to claim 1, wherein the non-emitting regions of the red, green and blue sub pixels of the pixel are in a zig-zag pattern.

8. The organic electroluminescent device according to claim 1, wherein two of the non-emitting regions in the pixel are aligned with each other.

9. A method of fabricating an organic electroluminescent device,
   the method comprising:
   forming a plurality gate lines and data lines crossly arranged on a substrate to define red, green and blue sub pixels of a pixel;
   forming a non-emitting region in each of the sub pixels, each non-emitting region including a switching element and a driving element; and
   forming an emitting region in each of the sub pixels, each emitting region including a pixel electrode connected to the corresponding driving element,
   wherein locations of at least two of the non-emitting regions are different from each other with respect to the corresponding sub pixels,
   wherein in the step of forming the non-emitting regions, each of the switching element and the driving element is formed with a thin film transistor having a gate electrode, an active layer, a source electrode and a drain electrode,
   wherein the drain electrode of the driving element is connected to an anode electrode of an emitting diode,
   wherein each of the red, green and blue sub pixels is formed to have a horizontal side longer than a vertical side, and
   wherein the horizontal side is parallel to the gate line and the vertical side is parallel to the data line.

10. The method according to claim 9, further comprising:
    forming a power line in electrical connection with the source electrode of the driving element.

11. The method according to claim 9, wherein in the step of forming the non-emitting regions, the non-emitting regions in the immediately adjacent sub pixels are formed at different locations.

12. The method according to claim 9, wherein the red, green and blue sub pixels of the pixel are arranged in a vertical direction.

13. The method according to claim 9, wherein in the step of forming the emitting regions, the emitting regions are made of red, green and blue organic materials.

14. The method according to claim 9, wherein the non-emitting regions of the red, green and blue sub pixels of the pixel are in a staggered pattern.

15. The method according to claim 9, wherein the non-emitting regions of the red, green and blue sub pixels of the pixel are in a zig-zag pattern.

16. The method according to claim 9, wherein two of the non-emitting regions in the pixel are aligned with each other.

* * * * *